United States Patent [19]

Berke

[11] 4,119,916
[45] Oct. 10, 1978

[54] PROGRAMMABLE CHARGE COUPLED DEVICE TIMING SYSTEM

[75] Inventor: Herbert Berke, Maitland, Fla.

[73] Assignee: The United States of America as represented by the Secretary of the Navy, Washington, D.C.

[21] Appl. No.: 798,289

[22] Filed: May 19, 1977

[51] Int. Cl.² .................................................. H03K 5/15
[52] U.S. Cl. ........................................ 328/62; 328/55;
328/48; 328/63; 328/73; 307/221 D
[58] Field of Search .................... 328/51, 55, 61, 62,
328/48, 129, 130, 63, 73, 75; 307/221 D, 247 R

[56] References Cited

U.S. PATENT DOCUMENTS

| | | |
|---|---|---|
| 3,422,359 | 1/1969 | Ladd et al. .............................. 328/62 |
| 3,473,129 | 10/1969 | Tschannen .......................... 328/61 X |
| 3,671,872 | 6/1972 | Pauly ..................................... 328/55 |
| 3,955,100 | 5/1976 | Takahashi et al. .............. 307/221 D |

Primary Examiner—John S. Heyman
Attorney, Agent, or Firm—Richard S. Sciascia; Don D. Doty

[57] ABSTRACT

A universal timing circuit for enabling numerous different types of charge coupled devices is disclosed which permits the operation thereof to be established over a wide range of counted and programmed clock input frequencies, thereby facilitating experimentation in faster scanning techniques, such as, for example, those which might be required when charge coupled image sensing devices are used as substitutes for vidicon tubes in various and sundry television systems.

17 Claims, 3 Drawing Figures

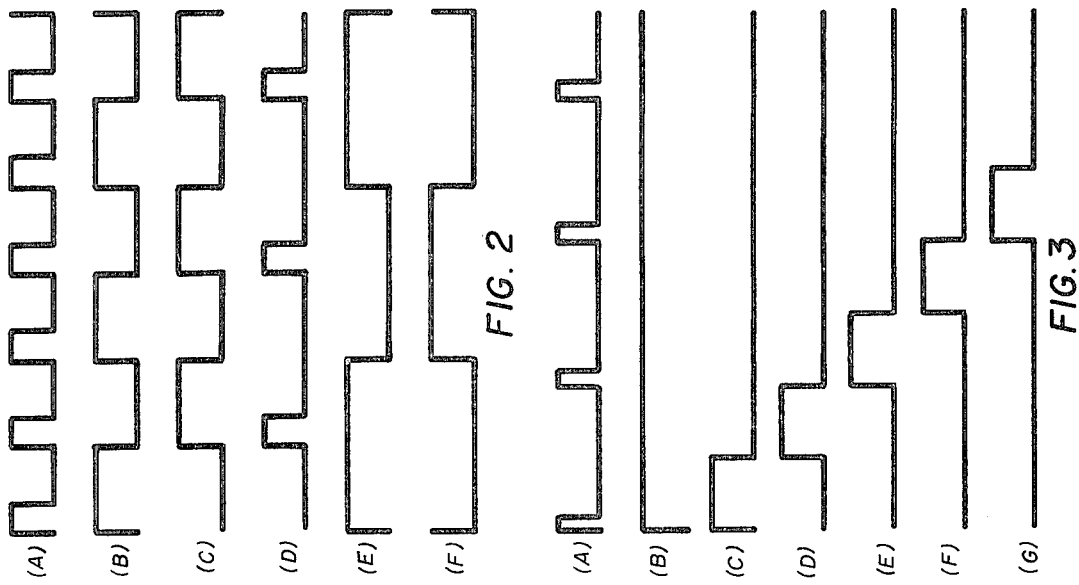
FIG. 2
FIG. 3
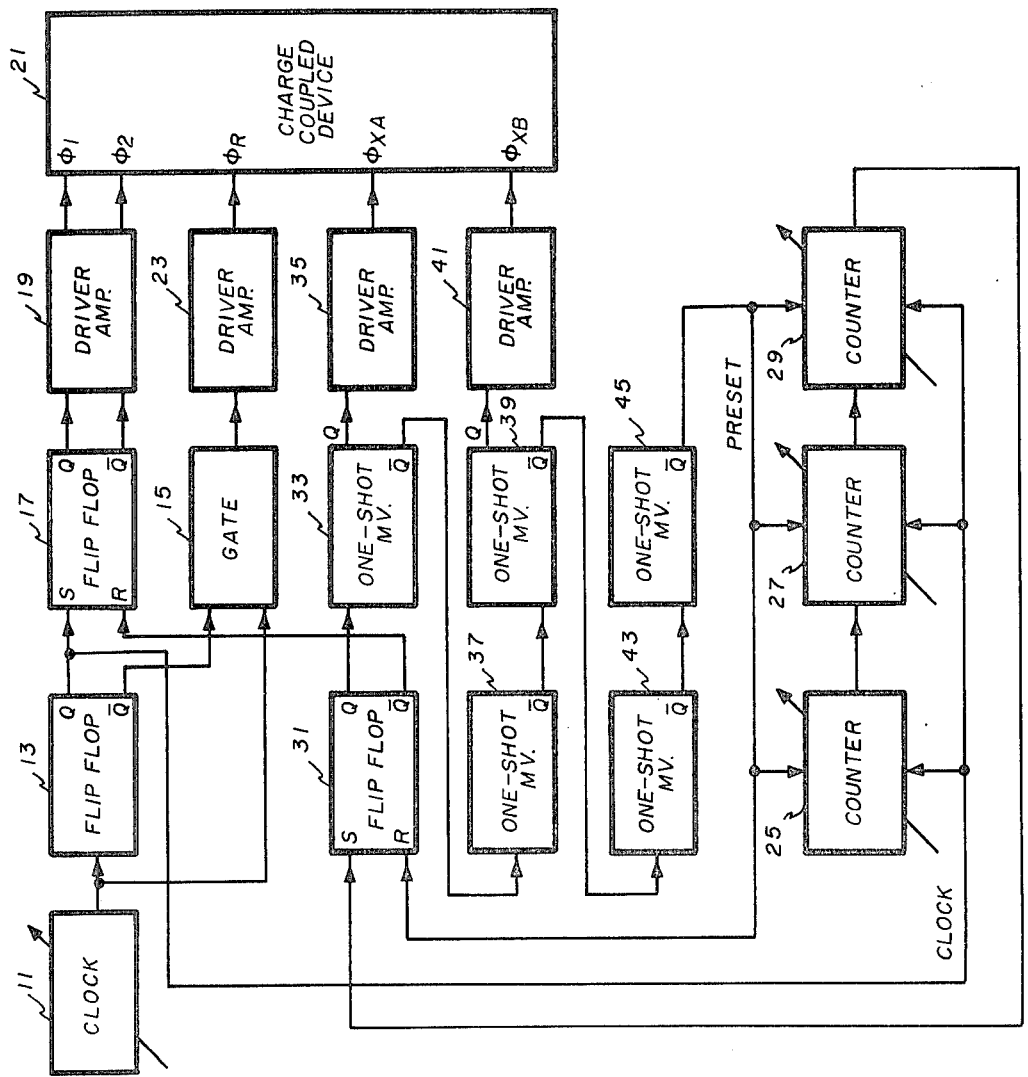
FIG. 1

PROGRAMMABLE CHARGE COUPLED DEVICE TIMING SYSTEM

FIELD OF THE INVENTION

The present invention, in general, relates to data processors and, in particular, is a signal generator which produces a variety of timing signals that are useful for controlling the operations — both internally and externally, as the case may be — of various and sundry complementary apparatus that may advantageously be associated therewith. In even greater particularity, the subject invention comprises an improved programmable method and means for timely enabling a charge coupled device (CCD), such as, for example, a charge coupled image sensing device (CCISD).

DESCRIPTION OF THE PRIOR ART

Heretofore, numerous programmable timing devices have been used for enabling various apparatus associated therewith; as a matter of fact, such devices are too numerous to discuss in detail here. However, for the sake of representation of some thereof which will help to lay the predicate for disclosing the instant invention and, even more important, for providing evidence of the exceptional structural and performance significance thereof due to the obvious distinguishment thereof therefrom, the following known prior art examples are presented herewith:

U.S. Pat. No. 3,290,606 to R. A. Rodner, dated Dec. 6, 1966, discloses an electronic circuit for producing pulse sequences of different rates. Two shift registers are incorporated therein which shift signals inserted therein in response to signals from an oscillator, wherein the oscillator pulses of one phase are coupled to shift inputs of the first shift register thereof while other phase oscillator pulses are coupled to the shift inputs of the second shift register thereof. Then, a set of decoding gates each having inputs connected to certain stages of both of said first and second shift registers, provide a sequence of timing pulses in response to the signals inserted therein and the aforesaid oscillator signals.

U.S. Pat. No. 3,582,795 to R. B. Heick, dated June 1, 1971, discloses the delayed clock pulse synchronizing of random input pulses. The invention disclosed therein contemplates a clock pulse counter for causing an output device to change state each time said counter counts a prescribed number of clock pulses, an input device controlled by input pulses to change state each time a change of input pulse level occurs, and control circuitry for (1) allowing the counter to count clock pulses when the input and output devices are in opposite states and (2) preventing the counter from counting clock pulses when the input and output devices are in the same state. A specific aspect of the prior art invention being discussed contemplates a resettable counter and means for resetting it to zero whenever the output device changes state. Such arrangements accomplish clock pulse synchronism while denying recognition of an input change lasting less time than the prescribed number of clock pulses, and while denying recognition of an input change with fine chatter unless the change persists in part or parts for an accumulation of time necessary to allow the prescribed number of clock pulses to be counted.

U.S. Pat. No. 3,590,280 to J. R. Hudson, dated June 29, 1971, discloses a variable multiphase clock system wherein a plurality of clock output signals are provided, the pulse width and time phase of which is variable in accordance with a plurality of control voltages applied thereto from a remote location, wherein each phase signal of said plurality of clock output signals comprises a first and second one-shot multivibrator, including an RC time constant that includes a field effect transistor that is operated as a voltage variable resistance which is controlled by separate control voltages, such that the time constant of a second one-shot multivibrator resets after the resetting of the first one-shot multivibrator, and a flipflop circuit coupled to said first and second one-shot multivibrators responsive to the output thereof for being triggered into a first state by the output of said first one-shot multivibrator and to its opposite state by the output of said second one-shot multivibrator.

U.S. Pat. No. 3,763,480 to P. K. Weimer, dated Oct. 2, 1973, discloses digital and analog handling devices, wherein charge transfer circuits in which a group of serially occurring signals are initially stored in a first charge storage register, then are transferred in parallel to parallel registers to permit, after each transfer, the first register again to be filled with a following group of serially occurring signals, and in which each group of signals are transferred from said parallel registers to an output register to be read out in series therefrom.

Although the aforementioned and other prior art devices function, for the most part, in satisfactory manners for their intended uses, respectively, they usually leave something to be desired from the simplicity and versatility standpoints. Consequently, even though the art in question may be crowded, there is still room for improvement; hence, for its intended purposes, the presently disclosed invention constitutes such improvement, in that it efficiently, uniquely, and economically generates and supplies certain timing control signals required for the proper (and perhaps optimum) operation of charge coupled devices, as well as other devices requiring similar control signals.

SUMMARY OF THE INVENTION

As previously suggested, the instant invention comprises a pulse generating system that may be used to produce a predetermined plurality of signals, the relative timing of which may be controlled by the preprogramming thereof. Said predetermined plurality of signals are now specifically defined as follows for the sake of facilitating the understanding of the subsequently discussed structural elements pertinent thereto:

$\phi_1$ and $\phi_2$ = analog shift register transport clock signals which are respectively applied to the gates of charge coupled device (CCD) shift registers, so as to move the charge packets received from the image sensor elements to the gated charge detector preamplifiers;

$\phi_R$ = a reset clock signal which contains a voltage waveform required to drive a gated charge detector amplifier of a charge coupled device; and $\phi_{XA}$ and $\phi_{XB}$ = transfer gate clock signals, the voltage waveforms of which are applied to the transfer gate, so to move the accumulated charge from the image sensor elements to the shift registers of a charge coupled device.

Generally speaking, included in the invention is a plurality of divider circuits for obtaining a plurality of different sweep frequency signals suitable for sweeping charge coupled devices and another plurality of programmable counter circuits that are selectively actuable and effectively connected to said divider circuits — and, thus, indirectly to said charge coupled devices — thereby effecting a particular sweep rate appropriate for enabling any selected one thereof, including a charge coupled imaging sensing device, merely by presetting or programming said counter circuits.

Therefore, an important object of this invention is to provide an improved programmable charge coupled device actuating signal generator.

Another object of this invention is to provide an improved timing signal generator.

Still another object of this invention is to provide an improved method and means for establishing the operation of a charge coupled device over a wide range of input clock frequencies, thereby, in turn, enabling experimentation in fostering scanning techniques.

A further object of this invention is to provide a method and means for supplying enabling signals to any charge coupled image sensing device, as a result of the programability thereof therefor.

Another object of this invention is to provide a method and means for driving charge coupled image sensing devices in such manner that they may replace vidicon tubes in television systems.

Other objects and many of the attendant advantages of this invention will be readily appreciated as the same becomes better understood by reference to the following detailed description, when considered in connection with the accompanying drawings wherein:

BRIEF DESCRIPTION OF THE DRAWING

FIG. 1 illustrates in block diagram form the signal timing system constituting the subject invention;

FIG. 2 is a graphical representation of various and sundry pulses which occur at the outputs of some of the elements of FIG. 1;

FIG. 3 is an expanded graphical illustration of several of the pulses depicted in FIG. 2 and other internal component output signals of the system of FIG. 1 coordinated therewith.

DESCRIPTION OF THE PREFERRED EMBODIMENT

Referring now to the embodiment of the invention illustrated in FIG. 1, there is shown an adjustable frequency clock 11 which produces a series of fundamental clock pulses at the output thereof, the frequency of which has been preset therein in accordance with the requirement of any given operational circumstances.

The output of clock 11 is connected to the data input (DI) of a flipflop 13 and the clock data input (C) of a control gate 15. The $\overline{Q}$ output of flipflop 13 is connected to the control input (CI) of said control gate 15, and the Q output thereof is connected to the data input (DI) of another flipflop 17. Flipflop 17 has two outputs, viz., Q and $\overline{Q}$, which are respectively connected to inputs of a drive amplifier 19 in such manners that the signals therefrom are amplified to more useful levels, thereby becoming phase 1 and phase 2 signals, herewith represented by the symbols $\phi_1$ and $\phi_2$, respectively. Thus, it may readily be seen that the $\phi_1$ and $\phi_2$ inputs of a charge coupled device 21 are connected to a pair of outputs of the aforesaid driver amplifier 19 for response to said phase 1 and phase 2 signals.

At this time, it would ostensively be noteworthy that charge coupled device 21 may be any charge coupled device — including any charge coupled imaging sensing device — that is suitable for being enabled in a proper manner by the aforesaid $\phi_1$ and $\phi_2$ signals, as well as certain ones of other signals produced by the subject invention, all of which will be discussed more fully subsequently.

For the purpose of clarity, as used herein, charge coupled device 21 may be defined as a semiconductor device in which isolated charge-packets are transported from one position in a semiconductor to an adjacent position by sequential clocking of an array of gates. Such charge packets are minority carriers with respect to the semiconductor substrate. With this in mind, the aforementioned $\phi_1$ and $\phi_2$ signals are defined as analog shift register transport clock signals or, in the alternative, two 2-phase clock signals that are applied to the gates of the CCD shift registers to move the charge packets received from the image sensor elements to the gated charge-detector preamplifiers.

The output of gate 15 is connected through a driver amplifier 23 to the $\phi_R$ input of the aforementioned charge coupled device 21.

The Q output of the aforesaid flipflop 13 is also connected to the clock inputs of a trio of adjustable digital counters 25, 27, and 29, each of which may be preset to start counting at some predetermined number and stop counting in accordance with the clock input signals supplied thereto. Hence, the output of digital counter 25 is connected to the data input of digital counter 27, and the output of digital counter 27 is connected to the input of digital counter 29. The data input of another flipflop 31 is connected to the output of counter 29, with the Q output thereof connected to the data input of a one-shot — that is, monostable — multivibrator 33. The $\overline{Q}$ output of flipflop 31 is connected to the reset input of the aforesaid flipflop 17, and the Q output of one-shot multivibrator is connected through a driver amplifier 35 to the $Q_{XA}$ input of the aforementioned charge coupled device 21. The $\overline{Q}$ of one-shot multivibrator 33 is connected to the data input of another one-shot multivibrator 37, and the $\overline{Q}$ output thereof is connected to the data input of still another one-shot multivibrator 39, the Q output of which is connected through a driver amplifier 41 to the $Q_{XB}$ input of the aforesaid charge coupled device. The $\overline{Q}$ output of one-shot multivibrator 39 is connected to the data input of another one-shot multivibrator 43, with the $\overline{Q}$ output thereof connected to the data input of one-shot multivibrator 45, with the $\overline{Q}$ output thereof connected to the preset inputs of each of the afore-mentioned digital counters 25, 27, and 29, and, in addition, to the reset input of flipflop 31, thereby completing the circuit of the instant invention.

At this time, it would appear to be noteworthy that all of the elements and components depicted in block form in FIG. 1 are well known, conventional, and commercially available per se; therefore, it is to be understood that it is their new and unique combination that constitutes the subject invention and, moreover, that accomplishes the improved objectives and results effectively stated above.

Again, for purposes of emphasis, it should be understood that the subject invention may include or drive any compatible apparatus which requires the aforedefined $\phi_1$, $\phi_2$, $\phi_R$, $\phi_{XA}$, and $\phi_{XB}$ signals supplied thereto for the intended functioning thereof. Nevertheless, for the particular preferred embodiment of the invention disclosed herewith, charge coupled device 21 of FIG. 1 may, in fact, be the CCD 131-1024 Element Linear Image Sensor charge coupled device manufactured by the Fairchild Camera and Instrument Corporation of Mountain View, Calif. Of course, it would obviously be well within the purview of one skilled in the art having the benefit of the teachings presented herewith to select whatever device as would be desirable for or useful as charge coupled device 21. Moreover, it would be readily apparent to the artisan that any other compatible signal generator or generators (not shown and, thus, not a part of this invention) may also be combined with charge coupled device 21, in order to supply any other signals required for the intended operation thereof.

In any event, the subject invention comprises the above defined new and useful combination of elements.

MODE OF OPERATION

The operation of the present invention will now be discussed briefly in conjunction with FIGS. 1, 2, and 3, with the latter two figures portraying representative signals having pulses with idealized waveforms.

Clock 11 of FIG. 1, as previously suggested, is the basic control element of the invention and, accordingly, generates a clock pulse signal having a preset frequency similar to that depicted in FIG. 2 (A). It is the clock signal that is supplied to the trigger or data input of flipflop 13, which, in turn, produces signals similar to those shown in FIGS. 2 (B) and 2 (C) at the Q and $\bar{Q}$ outputs thereof, respectively.

Also, the clock signal of FIG. 2 (A) and the $\bar{Q}$ signal of FIG. 2 (C) from the output of flipflop 13 are supplied to gate 15 as the data and control signals therefor, respectively. Hence, gate 15 is opened for the positive pulse duration of each of the pulses of the signal of FIG. 2 (C), thereby letting any clock signals that are present at the clock or data input thereof through. Consequently, as so programmed, the frequency of said clock pulses is divided in half in a manner similar to that illustrated in the signal of FIG. 2 (D) by the combined operations of flipflop 13 and gate 15.

The Q and $\bar{Q}$ output signals of flipflop 13 — respectively represented by the signals of FIG. 2 (B) and FIG. 2 (C) — are supplied to the inputs of flipflop 17 which, in turn, divide the frequencies thereof by two. Accordingly, the Q and $\bar{Q}$ output signals of said flipflop 17 appear similar to those of FIGS. 2 (E) and 2 (F). Then driveramplifier 19 amplifies and otherwise further processes them in such manner that they acquire whatever voltage levels as are required to drive charge coupled device 21 as signals $\phi_1$ and $\phi_2$, respectively. Hence, the signal waveforms of FIGS. 2 (E) and 2 (F) are, for all practical purposes, similar to those of the signals of the aforesaid $\phi_1$ and $\phi_2$ outputs from flipflop 17, too.

The aforementioned output signal from control gate 15 — the frequency of which is half of the output signal from clock 11 — is also amplified to a more useful voltage level before being supplied to charge coupled device 21 as signal $\phi_R$. Of course, except for voltage levels, signal $O_R$ looks similar to the signal waveform of FIG. 2 (D).

As exemplified in FIG. 3, wherein the time frame represented by the abscissa thereof has been expanded many times over that used in conjunction with FIG. 2, the signal of FIG. 2 (A) will be herewith defined, in general, as being the signal which emanates from the output of counter 29. However, as more specifically shown, it is intended, for the purposes of this explanation, to represent the 2048th pulse and some of the pulses successive thereto, for reasons which will be discussed more fully subsequently, and for the purpose of having a suitable starting point for discussing the remaining operations performed within the remainder of the system of FIG. 1.

Moreover, to facilitate the better understanding of that portion of the mode of operation of the invention to be discussed now, it would appear to be worthy of cognizance at this time that the signal waveform of FIG. 3 (B) is, in fact, identical to that of FIG. 2 (E); however, in the portrayal thereof in FIG. 3 (B), the time frame represented by the abscissa has been greatly expanded, so as to provide a frame that will permit the disclosure of the other signals shown in FIGS. 3 (C) through 3 (G).

In view of the foregoing, the signal of FIG. 3 (A), which emanates from the output of counter 29 of FIG. 1, is supplied as the data signal to the trigger input of the aforesaid flipflop 31, thereby causing it to timely change state with every pulse thereof. Then the Q output signal thereof — which also changes in voltage level — likewise triggers one-shot multivibrator 33 from a low to a high state for whatever time is predesigned therein, thereby pioducing a signal similar to that shown in FIG. 3 (C). After appropriate amplification to a more useful level by driver amplifier 35, the signal of FIG. 3 (C) when becomes signal $\phi_{XA}$ and is supplied to the $\phi_{XA}$ input of charge coupled device 21 for the proper and timely enabling thereof.

Then, in sequence, the $\bar{Q}$ output signal from one-shot multivibrator 33 timely triggers a change of state of one-shot multivibrator 37, thereby producing the signal of FIG. 3 (D) at the $\bar{Q}$ output thereof. And the $\bar{Q}$ output signal from one-shot multivibrator 37 timely triggers a change of state of one-shot multivibrator 39, so as to cause it to produce the signal of FIG. 3 (E) at the output thereof, which, after amplification by driver amplifier 41 becomes signal $\phi_{XB}$ that is supplied to the $\phi_{XB}$ input of charge coupled device 21 for the timely enabling thereof as necessary for it to function for its inteded use.

The $\bar{Q}$ output signal from one-shot multivibrator 39 then timely triggers one-shot multivibrator 43 to produce the signal of FIG. 3 (F) at the $\bar{Q}$ output thereof; and because the signal of FIG. 3 (F) timely triggers one-shot multivibrator 45 to a change of state condition, the signal of FIG. 3 (G) emanates from the $\bar{Q}$ output thereof and, thus, is supplied to the present inputs of each of the aforementioned counters 25, 27, and 29 for timely effecting the resetting thereof at some particular preset number, such as, for example, 320.

Of course, as readily may be seen by inspection of the respective timing of the highs of the signal waveforms of FIGS. 3 (C) through 3 (G), all of the aforementioned one-shot multivibrators 33, 37, 39, 43, and 45 are effectively delays, and delay times of which, in this particular case, are substantially equal, but which may be varied as desired to accommodate any given operational circumstances merely by changing the RC time constants thereof, since so doing would merely involve the making of design choices by the artisan.

Although only those output signals which were deemed significant or necessary for the adequate disclosure of this invention were illustrated in FIGS. 2 and 3, it should be understood that their counterparts were respectively equal and opposite thereto, as far as the polarities thereof are concerned. Hence, the Q output signals of the various components of FIG. 1 should be considered as being the inversions of the $\bar{Q}$ output signals therefrom and vice versa, even though only one or the other may have been shown in FIGS. 2 and 3, and even though some thereof may not have been used at all.

With this in mind, the $\overline{Q}$ output signal from one-shot multivibrator 45 (or the Q output signal therefrom not shown, as the case may be) not only supplies the signal of FIG. 3 (G) — or the inversion thereof — to the preset inputs of digital counters 25, 27, and 29, but also timely resets the above mentioned flipflop 31, so that it will be timely returned to its original state. Likewise, the $\overline{Q}$ output signal of flipflop 31 timely resets the aforementioned flipflop 17, thereby completing the subject invention.

In view of the foregoing, it may readily be seen that a unique, versatile, and improved signal generating system has been invented which may be used to an advantage to enable numerous charge coupled devices (CCDs) merely by changing the programming adjustments included therein, thereby obviating the need for the custom designing of actuation circuitry therefor; and, moreover, it is ostensively possible that other utilization devices (not shown) may be timely actuated by the signals generated thereby, too.

Obviously many modifications and variations of the present invention are possible in the light of the above teachings. It is, therefore, to be understood that within the scope of the appended claims the invention may be practiced otherwise than as specifically described.

What is claimed is:

1. Means for generating a plurality of timing signals, comprising in combination:
   a clock signal generator;
   a first flipflop having an input, a Q output, and a $\overline{Q}$ output, with the input thereof connected to the output of said clock signal generator;
   a second flipflop having a set input, a reset input, a Q output, and a $\overline{Q}$ output, with the set input thereof connected to the Q output of said first flipflop;
   counter means having a clock input, a preset input, and an output, with the clock input thereof connected to the output of said clock signal generator;
   another flipflop having a set input, a reset input, a Q output, and a $\overline{Q}$ output, with the set input thereof connected to the output of said counter means, with the reset input thereof connected to the preset input of said counter means, and with the $\overline{Q}$ output thereof connected to the reset input of said second flipflop; and
   delay means effectively connected between the Q output of said another flipflop and the preset input of the aforesaid counter means for timely supplying a predetermined delayed signal thereto and to the reset input of said another flipflop.

2. The invention of claim 1, further characterized by a control gate having a clock signal input, a control signal input, and an output, with the clock signal input thereof connected to the output of said clock signal generator, and with the control input thereof connected to the $\overline{Q}$ output of the aforesaid first flipflop.

3. The device of claim 1, wherein said counter means comprises a predetermined plurality of adjustable, series connected, digital counters.

4. The device of claim 1, wherein said delay means comprises a predetermined plurality of series connected one-shot multivibrators.

5. The invention of claim 4, further characterized by:
   a first driver amplifier connected to an output of said second flipflop;
   a second driver amplifier connected to an output of a predetermined one of said plurality of series connected one-shot multivibrators; and
   a third driver amplifier connected to an output of a predetermined another of said plurality of series connected one-shot multivibrators.

6. A charge coupled device signal generator, comprising in combination:
   means for generating a fundamental frequency first signals;
   means connected to the output of said fundamental frequency first signal generating means for simultaneously generating a second signal having a frequency that is one-half that of said first signal, and third and fourth frequency signals, the third of which is one hundred and eighty degrees out of phase with the fourth thereof, with the polarity of the fourth signal thereof in concurrence with that of the aforesaid second signal;
   means connected to one of the outputs of said last mentioned means for simultaneously generating a fifth signal that has half the frequency of the aforesaid third signal and a sixth signal that has the same frequency as said fifth signal and is 180° out of phase therewith in response to a seventh signal;
   means effectively connected between an output of said third signal producing means and an input of said fifth and sixth signal producing means for timely supplying said seventh signal thereto and for generating an eighth output signal that has been delayed a first predetermined time period with respect to the beginning of the aforesaid fifth signal; and
   means connected to an output of said last mentioned means for generating a ninth signal that has been delayed a second predetermined time period with respect to the beginning of the aforesaid fifth signal that is less than the delay of said eighth output signal.

7. The device of claim 6, wherein said means for generating a fundamental frequency first signal comprises an adjustable frequency clock signal generator.

8. The device of claim 6, wherein said means connected to the output of said fundamental frequency first signal generating means for simultaneously generating a second signal having a frequency that is one-half that of said first signal, and third and fourth frequency signals, the third of which is 180° out of phase with the fourth thereof, with the polarity of the fourth signal thereof in concurrence with that of the aforesaid second signal comprises:
   a first flipflop having a trigger input, a Q output, and a $\overline{Q}$ output;
   a control gate having a data input, a control input, and an output, with the data input thereof connected to the output of said fundamental frequency first signal generating means, and with the control input thereof connected to the $\overline{Q}$ output of said first flipflop;
   a second flipflop having a set input, a reset input, a Q output, and a $\overline{Q}$ output, with the set input thereof connected to the Q output of said first flipflop;
   a third flipflop having a set input, a reset input, a Q output, and a $\overline{Q}$ output, with the $\overline{Q}$ output thereof connected to the reset input of said second flipflop; and
   delay line means having a pair of inputs and a pair of outputs, with the inputs thereof respectively connected to the Q output of said first flipflop and the $\overline{Q}$ output of said third flipflop, and with the outputs thereof respectively connected to the set and reset inputs of the aforesaid third flipflop, for timely supplying delayed set and reset signals thereto.

9. The device of claim 6, wherein said means connected to one of the outputs of said last mentioned means for simultaneously generating a fifth signal that has half the frequency of the aforesaid second signal and a sixth signal that has the same frequency as said fifth signal and is 180° out of phase therewith in response to a seventh signal comprises:
 a first one-shot multivibrator having an input, a Q output, and a $\overline{Q}$ output;
 a second one-shot multivibrator having an input and a $\overline{Q}$ output, with the input thereof connected to the $\overline{Q}$ output of said first one-shot multivibrator; and
 a third one-shot multivibrator having an input and a Q output, with the input thereof connected to the $\overline{Q}$ output of the aforesaid second one-shot multivibrator.

10. The device of claim 6, wherein said means effectively connected between an output of said third signal producing means and an input of said fifth and sixth signal producing means for timely supplying said seventh signal thereto and for generating an eighth output signal that has been delayed a first predetermined time period with respect to the beginning of the aforesaid fifth signal comprises:
 counter means having a clock input and a preset input, with the clock input thereof connected to the output of said third signal producing means;
 a flipflop having a set input, a reset input, and a Q output, with the set input thereof connected to the output of said counter means; and
 a delay means having an input and an output, with the input thereof connected to the Q output of said flipflop, and with the output thereof connected to the preset input of said counter means and the reset input of the aforesaid flipflop.

11. A signal generating system, comprising in combination:
 a clock signal generator;
 a first flipflop having a trigger input and a pair of outputs, with the trigger input thereof connected to the output of said clock signal generator;
 a second flipflop having a set input, a reset input, and a pair of outputs, with the set input thereof connected to one of the outputs of said first flipflop;
 a control gate having a clock input, a control input, and an output, with the clock input thereof connected to the output of said clock signal generator, and with the control input thereof connected to the other output of said first flipflop;
 counter means having a clock input, a preset input, and an output, with the clock input thereof connected to said one of the outputs of said first flipflop;
 a third flipflop having a set input, a reset input, and a pair of outputs, with the set input thereof connected to the output of the aforesaid counter means, and with one of the outputs thereof connected to the reset input of said second flipflop;
 a first one-shot multivibrator having an input and a pair of outputs, with the input thereof connected to the other output of said third flipflop;
 a second one-shot multivibrator having an input and an output, with the input thereof connected to one of the outputs of said first one-shot multivibrator;
 a third one-shot multivibrator having an input and a pair of outputs, with the input thereof connected to the output of said second one-shot multivibrator; and
 a delay means connected between one of the outputs of said third one-shot multivibrator, the reset input of said third flipflop, and the preset input of the aforesaid counter means for timely delaying a preset signal thereto.

12. The device of claim 11, wherein said counter means comprises:
 a first counter having a clock input, a preset input, and an output, with the clock input thereof connected to one of the outputs of said first flipflop, and with the preset input thereof connected to the output of said delay means;
 a second counter having a data input, a clock input, a preset input, and an output, with the data input thereof connected to the output of said first counter, with the clock input thereof connected to one of the outputs of said first flipflop, and with the preset input thereof connected to the output of said delay means; and
 a third counter having a data input, a clock input, a preset input, and an output, with the data input thereof connected to the output of said second counter, with the clock input thereof connected to one of the outputs of said first flipflop, with the preset input thereof connected to the output of said delay means, and with the output thereof connected to the set input of the aforesaid third flipflop.

13. The device of claim 11, wherein said delay means comprises:
 another one-shot multivibrator having an input and an output, with the input thereof connected to one of the outputs of said third one-shot multivibrator;
 still another one-shot multivibrator having an input and an output, with the input thereof connected to the output of said another one-shot multivibrator, and with the output thereof connected to the set input of the aforesaid third flipflop.

14. The invention of claim 11, further characterized by a charge coupled device having a plurality of inputs and at least one output, with a predetermined number of said plurality of inputs effectively connected to predetermined outputs of the aforesaid second flipflop, control gate, first one-shot multivibrator, and third one-shot multivibrator, respectively.

15. A charge coupled device signal generator, comprising in combination:
 means for generating a fundamental frequency first signal;
 means connected to the output of said fundamental frequency first signal generating means for simultaneously generating a second signal having a frequency that is one-half that of said first signal, and third and fourth frequency signals, the third signal of which is 180° out of phase with the fourth signal thereof, with the polarity of the fourth signal thereof being in concurrence with that of the aforesaid second signal;
 means connected to one of the outputs of said last mentioned means for simultaneously generating a fifth signal that is one-half of the frequency of the aforesaid third signal and a sixth signal that has the same frequency as said fifth signal and is 180° out of phase therewith in response to a seventh signal;

means effectively connected between an output of said third signal producing means and an input of said fifth and sixth signal producing means for timely supplying said seventh signal thereto and for producing eighth and ninth signals that have been respectively delayed first and second predetermined time periods with respect to the beginning of the aforesaid fifth signal, said means including counter means having a clock input and a preset input, with the clock input thereof connected to the output of said third signal producing means; a flipflop having a set input, a reset input, a Q output, and a $\overline{Q}$ output, with the set input thereof connected to the output of said counter means, and with the $\overline{Q}$ output thereof connected to said input of the aforesaid fifth and sixth signal producing means; and a delay means having an input and an output, with the input thereof connected to the Q output of said flipflop and with the output thereof connected to the preset input of said counter means and the reset of the aforesaid flipflop.

16. The invention of claim 15, further characterized by a utilization apparatus connected to the respective outputs of said second, fifth, sixth, eighth, and ninth signal generating and producing means for response to said second, fifth, sixth, eighth, and ninth signals.

17. The device of claim 16, wherein said utilization apparatus comprises a charge coupled device.

* * * * *